United States Patent
Okajima et al.

(10) Patent No.: US 7,279,661 B2
(45) Date of Patent: Oct. 9, 2007

(54) HEATING APPARATUS

(75) Inventors: Hisakazu Okajima, Nishikasugai-gun (JP); Yutaka Unno, Handa (JP); Keiji Kawasaki, Seto (JP)

(73) Assignee: NGK Insulators, Ltd., Nagoya (JP)

( * ) Notice: Subject to any disclaimer, the term of this patent is extended or adjusted under 35 U.S.C. 154(b) by 70 days.

(21) Appl. No.: 10/253,456

(22) Filed: Sep. 24, 2002

(65) Prior Publication Data
US 2003/0075537 A1    Apr. 24, 2003

(30) Foreign Application Priority Data
Oct. 24, 2001 (JP) ............................ 2001-326479

(51) Int. Cl.
*H05B 3/68* (2006.01)
*H05B 3/50* (2006.01)
(52) U.S. Cl. .................................. 219/444.1; 219/544
(58) Field of Classification Search ............ 219/444.1, 219/468.1, 543, 544, 546, 547, 548; 118/724, 118/725
See application file for complete search history.

(56) References Cited

U.S. PATENT DOCUMENTS

| | | | | |
|---|---|---|---|---|
| 4,843,218 A | * | 6/1989 | Husslein et al. | 219/466.1 |
| 5,573,690 A | * | 11/1996 | Nobori et al. | 219/458.1 |
| 5,688,331 A | * | 11/1997 | Aruga et al. | 118/725 |
| 5,946,183 A | * | 8/1999 | Yamada et al. | 361/234 |
| 6,035,101 A | * | 3/2000 | Sajoto et al. | 392/416 |
| 6,150,636 A | * | 11/2000 | Bogdanski et al. | 219/461.1 |
| 6,160,244 A | * | 12/2000 | Ohashi | 219/444.1 |
| 6,469,283 B1 | * | 10/2002 | Burkhart et al. | 219/486 |
| 6,488,820 B1 | | 12/2002 | Burkhart | |

FOREIGN PATENT DOCUMENTS

| | | |
|---|---|---|
| JP | 63-278322 | 11/1988 |
| JP | 07-297005 | 11/1995 |
| JP | 2001-052843 | 2/2001 |
| JP | 2001-102157 | 4/2001 |

* cited by examiner

*Primary Examiner*—Sang Paik
(74) *Attorney, Agent, or Firm*—Burr & Brown

(57) ABSTRACT

A heating apparatus for a semiconductor producing system is provided, including a heater having a mounting face, an opposed back face, a first resistance heating element, a second resistance heating element provided along substantially the same plane as the first heating element, a first terminal connected with the first heating element and a second terminal connected with the second heating element. A supporting member is fixed to the back face of the heater. First and second power supply means are respectively connected with the first and second terminals and contained in an inner space of the supporting member. A conductive connector connects the first heating element and the first terminal but not the second heating element. The first heating element is provided in a first zone, the second heating element is provided in a second zone, and the conductive connector is provided in the plane and the second zone.

1 Claim, 7 Drawing Sheets

Fig. 7
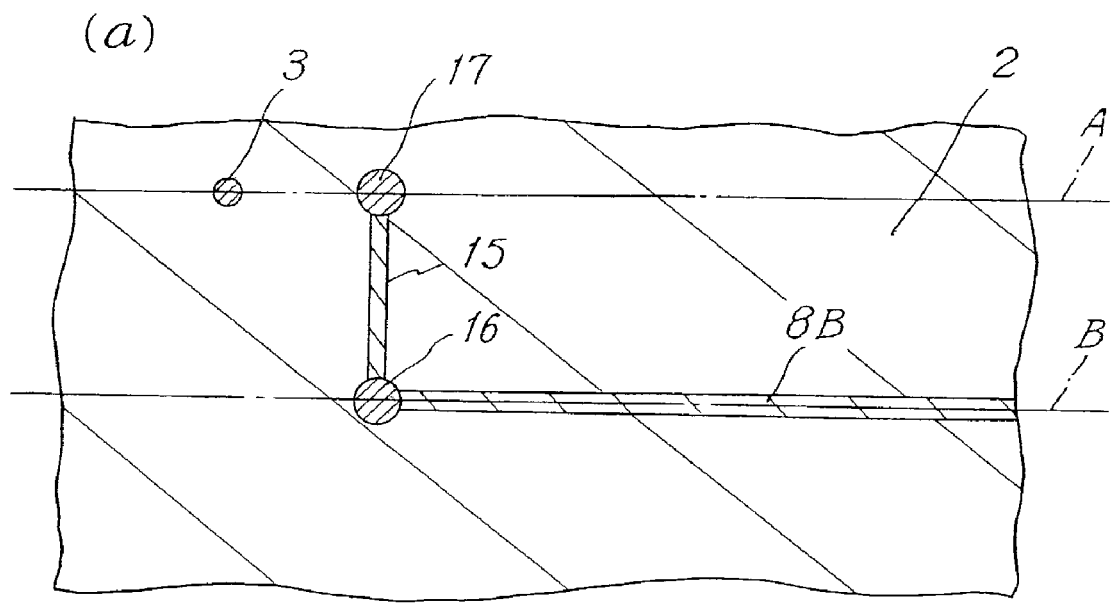
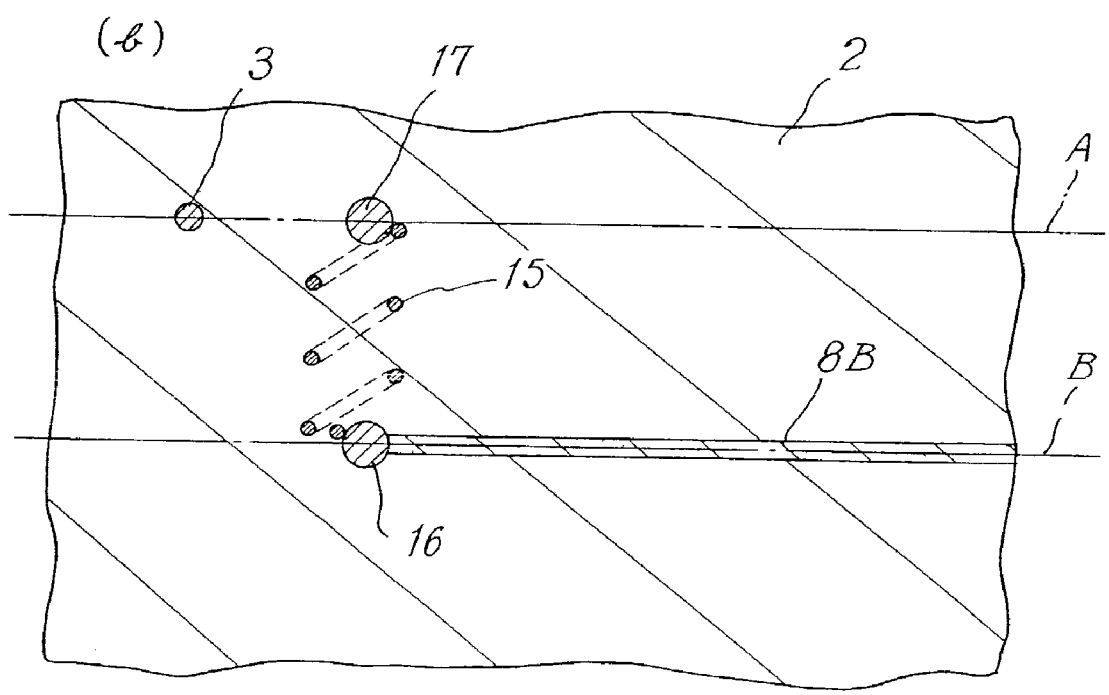

HEATING APPARATUS

This application claims the benefit of Japanese Patent Application P2001-326479 filed on Oct. 24, 2001, the entirety of which is incorporated by reference.

BACKGROUND OF THE INVENTION

1. Field of the Invention

The invention relates to a heating apparatus.

2. Related Art Statement

In a system for producing semiconductors, a ceramic heater may be provided for heating a wafer so as to deposit a semiconductor thin film on the wafer from gaseous raw materials such as silane gas by means of thermal CVD or the like. So called two-zone heaters are known as such ceramic heater. Such a two-zone heater has a ceramic substrate and inner and outer resistance heat generators embedded within the substrate. Separate power supply terminals are connected to the respective heat generators so that electric power may be applied independently on the respective generators. The inner and outer heat generators may be thus independently controlled.

Examples of such two-zone heater include the following. Japanese patent publication 2001-102157A discloses a heater having a ceramic substrate and two layers of heating elements embedded in the substrate. The calorific values in the inner zone and outer zone of each heating element are controlled so that two-zone control system of controlling inner and outer zones may be realized.

Further, Japanese patent publication 2001-52843A discloses a heater having a disk-shaped ceramic substrate and a plurality of heating elements provided on the surface of the substrate. Each heating element has a shape of a ring. The heating elements are positioned concentrically and made of a sintered body of metal powder. Electric power may be supplied to the heating elements independently.

According to the disclosure in Japanese patent publication 2001-102157A, two layers of heating elements are embedded in the substrate. However, the thickness of the ceramic layers under and over each heating element in the substrate are different from each other. The heat capacities of the ceramic layers under and over each element are thus different from each other. Such a difference in heat capacities may induce excessive thermal conduction in the thickness direction of the substrate. The uniformity of temperature on a mounting face for a semiconductor may be thereby deteriorated so that the temperature distribution on the mounting face is out of specification. Moreover, the additional shaping steps needed to embed two layers of heating elements in a ceramic shaped body reduce the productivity of the heater. Furthermore, the two layers of heating elements demands a thicker ceramic substrate, so that the total heat capacity of the heater is increased which reduces its responsiveness during temperature ascending and descending stages.

According to the disclosure in Japanese patent publication 2001-52843, a connector for a terminal is provided for each heating element. The connector and terminal are exposed to atmosphere surrounding the heater. In particular, the atmosphere in a semiconductor producing system may contain various corrosive gases, or their plasmas, such as a processing gas or cleaning gas. If the connector and terminal are exposed to such a corrosive atmosphere, the heater may have a shorter operational life. Moreover, at a back face of the ceramic substrate, it is necessary to provide a wiring construction to be connected with each of the heating elements. Such a wiring system may be complex and complicated. Furthermore, a complicated structure is also needed for fixing the heater to a semiconductor producing chamber, because of the complicated wiring construction at the back face of the heater.

SUMMARY OF THE INVENTION

An object of the present invention is to provide a heating apparatus for a semiconductor producing system wherein the temperature uniformity on a semiconductor mounting face is improved and wherein a terminal of the heater is not exposed to the system atmosphere. It is another object of the invention, in the heating apparatus, to prevent an increase in the heat capacity of the heating system and to facilitate fixing the heater to the system.

The present invention provides a heating apparatus for a semiconductor producing system. The heating apparatus includes a heater having a mounting face for mounting a semiconductor and a back face, and a supporting member fixed to the back face of the heater that has an outer surface and an inner surface facing an inner space. The apparatus further comprises first power supply means and second power supply means. The heater comprises a plate-shaped substrate including the mounting face, a first resistance-heating element composed of a resistance heating material, and a second resistance-heating element composed of a resistance heating material which is independently controllable with respect to the first heating element. The heater further comprises a first terminal connected to the first resistance-heating element, and a second terminal connected to the second resistance-heating element. The supporting member has a length that is larger than the width thereof. The first power supply means is connected with the first terminal and contained in the inner space of the supporting member, and the second power supply means is connected with the second terminal and contained in the inner space of the supporting member. The first and second heating elements are provided substantially along the same plane so that the first and second heating elements are not electrically connected with each other.

According to the present invention, the first and second heating elements are provided substantially along the same plane and thus combined so as to realize a two-zone control system or a multi-zone control system utilizing three or more zones. It is thereby possible to improve the temperature uniformity on the semiconductor mounting face of the heater.

At the same time, the first and second heating elements are provided substantially along the same plane so that lamination of the heating elements is avoided. It is thus possible to prevent an inevitable increase of the thickness of the substrate due to the lamination of elements and prevent a corresponding increase in the heat capacity of the heating apparatus. As a result, the responsiveness of the heating apparatus may be improved during heating and cooling, e.g., temperature ascending and descending stages. Additionally, the weight of the heater may be reduced.

Further, a hollow supporting member is fixed onto the back face of the heater. The hollow supporting member defines an inner space containing a first power supply means connected with a first terminal and a second power supply means connected with a second terminal. It is thus possible to facilitate fixing the heater to a semiconductor producing system. In addition, since the weight of the heater itself is reduced, as described above, the heater may be easily supported by the hollow supporting member. Moreover, since the first and second terminals are contained in the inner space of the supporting member, and are thus separated from the system atmosphere of the semiconductor producing system. It is thereby possible to prevent or reduce corrosion of the terminals so as to improve the operational life of the heater and to prevent metal contamination of a semiconductor.

Furthermore, the supporting member has a length that is larger than the width of the supporting member, so as to reduce the thermal conduction from the heater through the supporting member to a connecting part of the supporting member and the semiconductor producing system. The temperature uniformity on the semiconductor mounting face may be thereby improved.

The back face of the heater is a face opposing the semiconductor mounting face of the heater.

BRIEF DESCRIPTION OF THE DRAWINGS

These and other objects, features and advantages of the invention will be appreciated upon reading the following detailed description of the invention taken in conjunction with the attached drawings, with the understanding that some modifications, variations and changes of the same could be made by the skilled person in the art, and in which:

FIG. 7 (a) is an enlarged cross sectional view showing a connecting part of a first heating element 3 and a conductive connector 8B; and FIG. 7(b) is an enlarged cross sectional view showing another embodiment of a connecting part of a first heating element 3 and a conductive connector 8B.

DETAILED DESCRIPTION OF THE INVENTION

Figure 1:
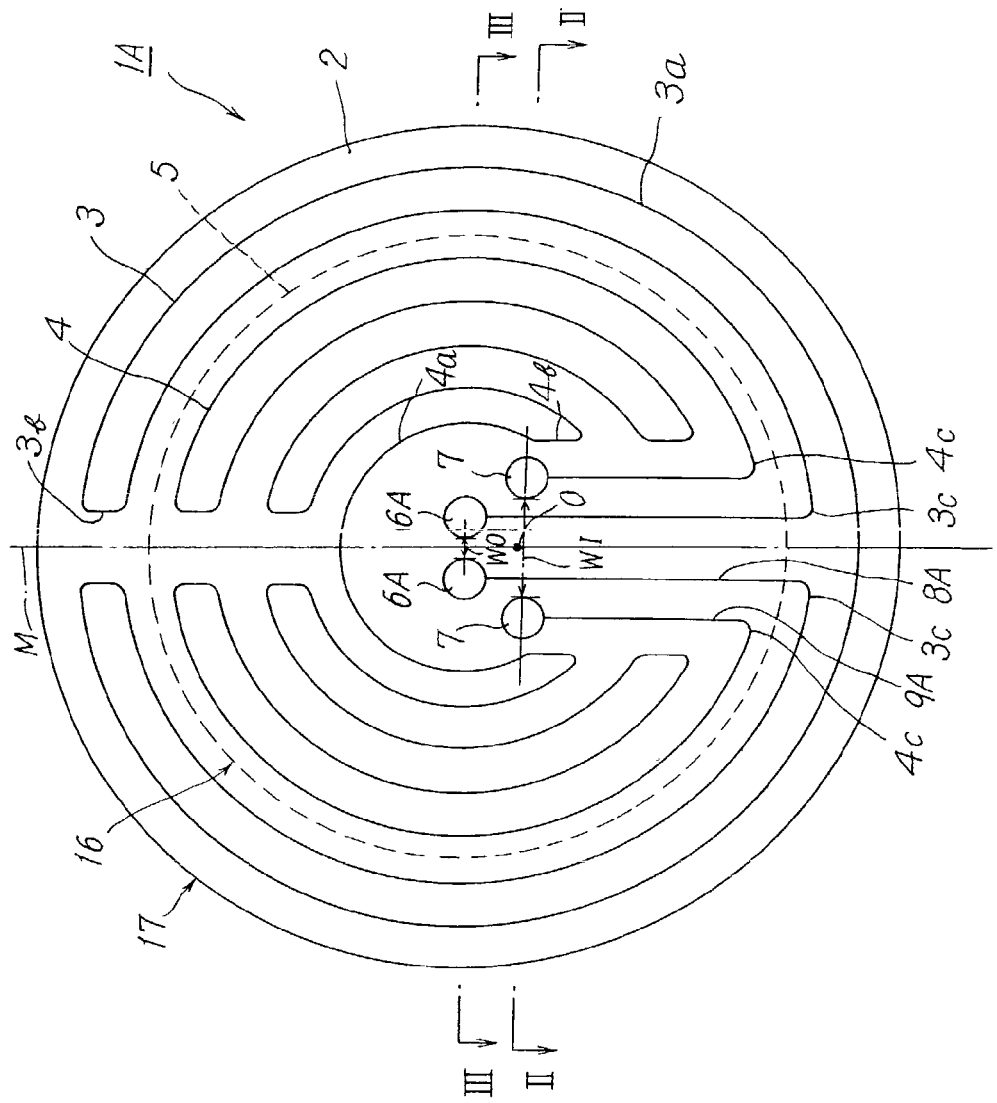
FIG. 1 is a schematic view showing a planar pattern of heating elements and conductive connectors in a heater 1A according to one embodiment of the present invention.

The present invention will be described further in detail, referring to the attached drawings. FIG. 1 is a schematic view showing a planar pattern of heating elements in a plane "A" in a heating apparatus 10A according to one embodiment of the present invention, which is best understood when read in conjunction with FIG. 2, which is a cross sectional view showing a heating apparatus 10A cut along a line II-II, and FIG. 3, which is a cross sectional view showing the heating apparatus 10A cut along a line III-III in FIG. 1.

The heating apparatus 10A has a disk-shaped heater 1A and a supporting member 11. The heater 1A has a disk-shaped substrate 2. The substrate 2 has one main face as a semiconductor mounting face 2a for mounting a semiconductor W. The other main face of the substrate 2 is a back face 2b that is joined with an end face 11c of the supporting member 11.

The substrate 2 is made of an insulating material. A first heating element 3 and a second heating element 4 are embedded in the substrate 2 along a specified plane "A". The first heating element 3 has arc-shaped portions 3a and a connecting portion 3b extending in a radial direction and connecting the arc portions. The first heating element 3 has, for example, two ends 3c, and each end 3c is connected with one end of the conductive connector 8A. The other end of the connector 8A is connected with a terminal 6A exposed to the back face 2b.

The second heating element 4 has arc-shaped portions 4a formed concentrically and connecting portions 4b each extending in a radial direction and connecting the adjacent arc portions 4a. The second heating element 4 has, for example, two end portions 4c each being connected with one end of a conductive connector 9A. The other ends of the conductive connectors 9A are connected to terminals 7, respectively. The terminals 7 are exposed to the back face 2b. The first heating element 3 is provided in a first zone 17 and the second heating element 4 is provided in a second zone 16. The numeral 5 denotes the interface of the two zones.

In the present example, conductive connectors 8A are provided for the first heating element 3 in the outer zone 17 and between the conductive connectors 9A for the second heating element 4 in the inner zone 16. The distance "WI" between a pair of the terminals 7 for the inner heating element 4 is larger than the distance "WO" between a pair of terminals 6A for the outer heating element 3.

The end face 11c of the hollow supporting member 11 is joined with the back face 2b of the heater 1A. The method for joining is not particularly limited. The joining may be carried out by soldering or solid phase welding as described in Japanese patent publication P8-73280A. The heater 1A and supporting member 11 may be joined and sealed using a sealing member such as an O-ring and a metal packing.

The supporting member 11 has a cylindrical shape. The supporting member 11 defines an inner space 12 separated from atmosphere 13 in a chamber. A first power supply means 15 and a second power supply means 14 are contained in the inner space 12. The first power supply means 15 is connected with the terminal 6A and the second power supply means is connected with the terminal 7. 11a denotes an outer surface and 11b denotes an inner surface of the supporting member 11. According to the present invention, the supporting member 11 has a length larger than the width "L" of the means 11. The width of the supporting member 11 is measured based on its outer surface 11a, and is different from the thickness of the supporting member. In other words, the width "L" is defined as a distance between the opposing points "P" on the outer surface 11a in a cross section shown in FIG. 2. When the supporting member is cylindrical, the width "L" is identical with an outer diameter of the supporting member.

According to the heating apparatus of the present example, the first and second heating elements 3, 4 are provided substantially along the same plane "A" and combined so as to realize two-zone control system. Further, the first and second heating elements 3, 4 are provided substantially along the same plane "A", so that the lamination of the heating elements is avoided. It is thus possible to prevent an inevitable increase of the thickness of the substrate due to the lamination of elements and an increase of heat capacity of the heating apparatus. Additionally, the weight of the heater may be reduced.

Further, the hollow supporting member 11 is fixed onto the back face 2b of the heater 1A. The first power supply means 15 connected with the first terminal 6A and the second power supply means 14 connected with the second terminal 7 are contained in the inner space 12 of the supporting member 11. The supporting member 11 may be easily fixed to an outer member such as a chamber of a system for producing a semiconductor. The weight of the heater 1A itself is reduced as described above so that the heater may be easily supported with the hollow supporting member 11. Moreover, the first and second terminals 6A, 7 are contained in the inner space 12 of the supporting member and thus separated from atmosphere 13 in a system for producing a semiconductor. It is thereby possible to prevent or reduce the corrosion of the terminals 6A, 7 and means 14, 15 so as to improve the operational life of the heater 1A and to prevent the metal contamination of a semiconductor.

A system for producing a semiconductor means a system that can be used in a wide variety of semiconductor processing in which metal contamination of a semiconductor is to be avoided. Such systems include film forming, etching, cleaning and testing systems. The semiconductor may be of any shape and the kinds are not particularly limited. For example, the semiconductor may have a wafer shape and may preferably be a silicon wafer.

The materials of the plate-shaped substrate for the heater are not particularly limited. The material for the substrate may be a known ceramic material including a nitride ceramic, such as aluminum nitride, silicon nitride, boron nitride and sialon, and an alumina-silicon carbide composite material. Aluminum nitride or alumina is most preferred for providing a high anti-corrosion property against a corrosive gas, such as a halogen-based corrosive gas.

The shape of the substrate is not particularly limited and may preferably be disk shaped. Pocket shaped parts, emboss-shaped parts, or grooves may be formed on the semiconductor mounting face.

The method for producing the heater is not particularly limited, and the heater is preferably produced by hot pressing or hot isostatic pressing.

The material of the supporting member is not particularly limited. The material may be a known ceramic material, including a nitride ceramic such as aluminum nitride, silicon nitride, boron nitride and sialon, and an alumina-silicon carbide composite material.

Figure 2:
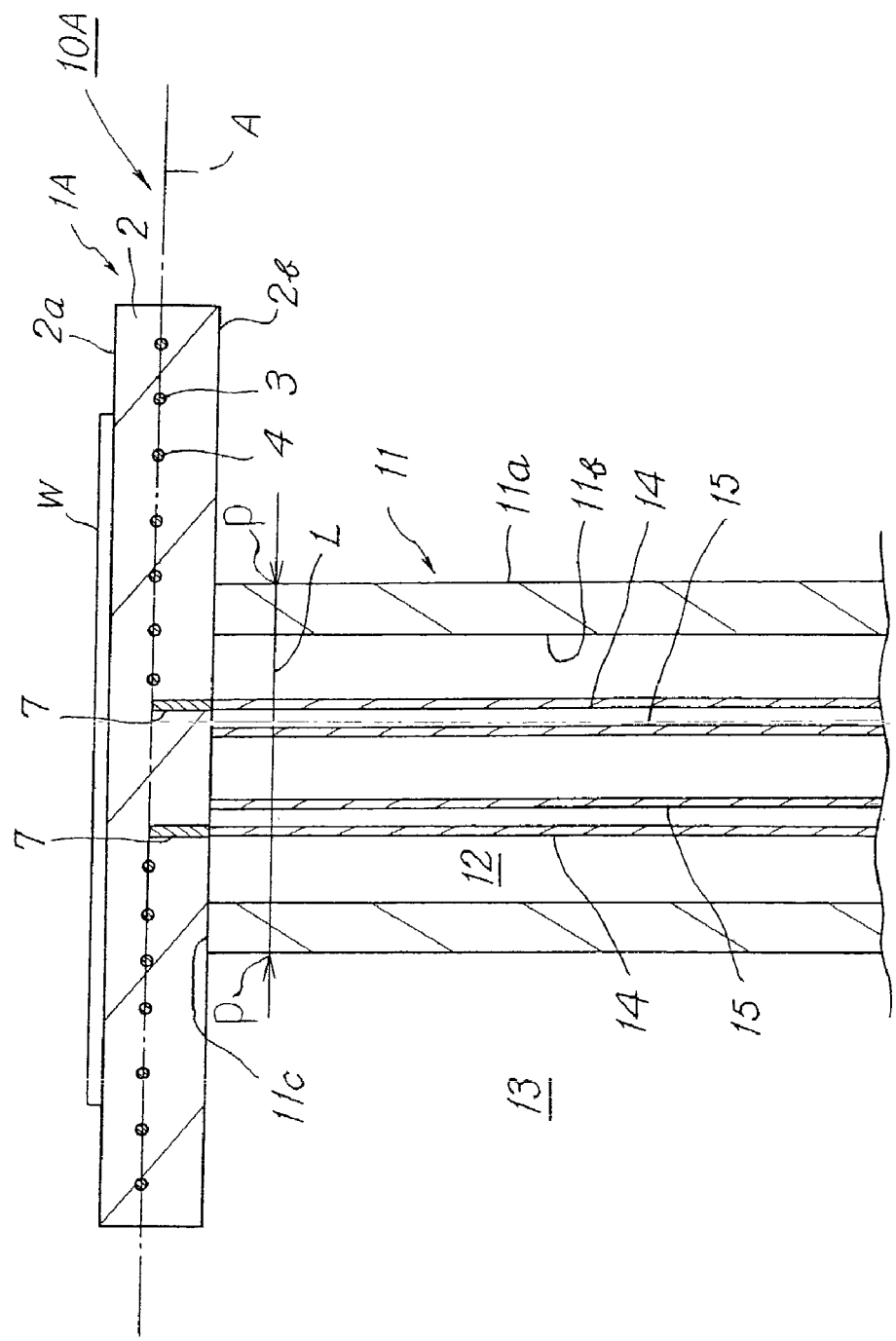
FIG. 2 is a cross sectional view showing a heating apparatus 10A cut along a line II-II of FIG. 1.
Figure 3:
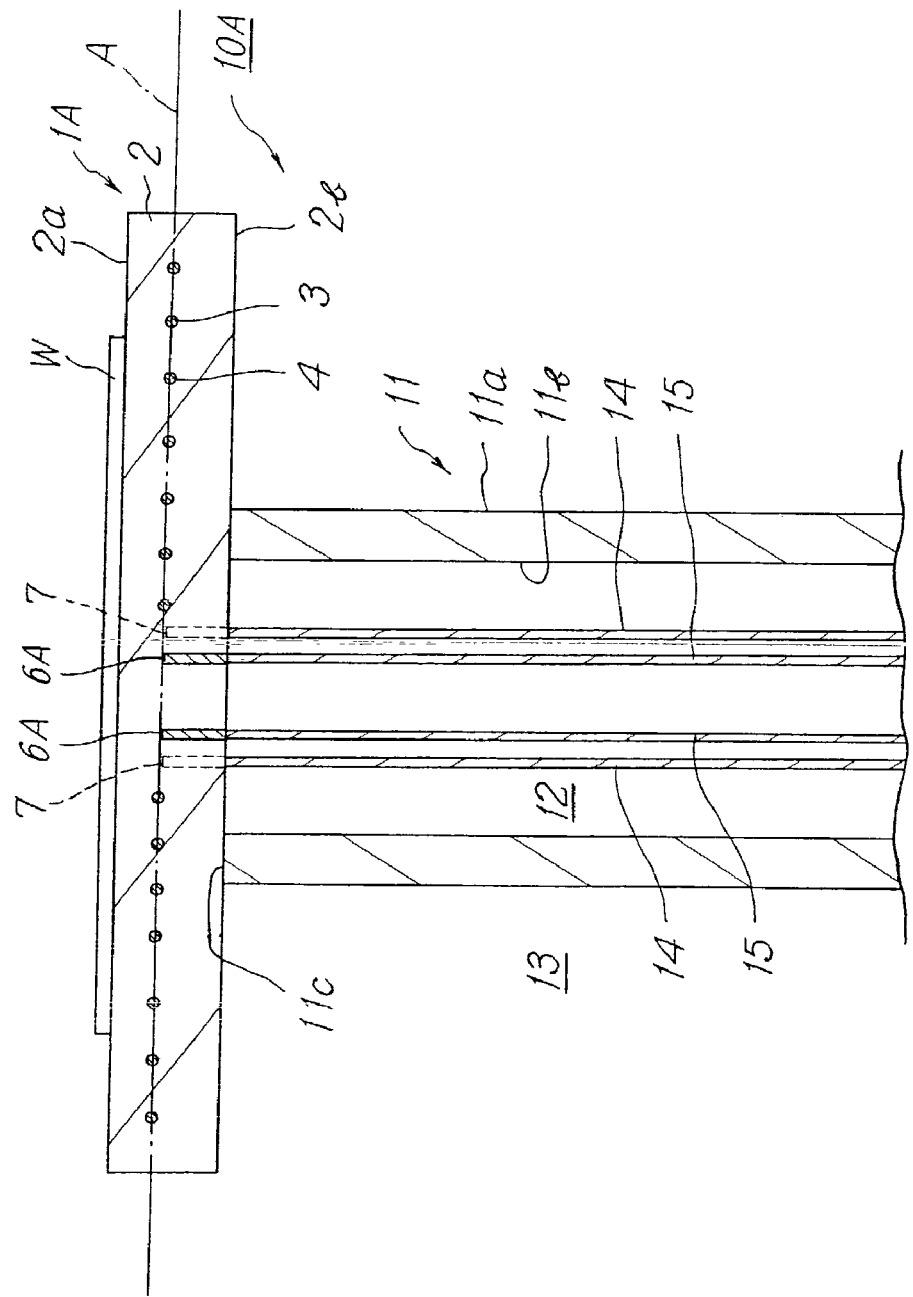
FIG. 3 is a cross sectional view showing a heating apparatus 10A cut along a line III-III of FIG. 1.

The shape of the heating element may be coil, ribbon, mesh, plate or film. FIGS. 1 to 3 show only the planar pattern of each heating element and do not specifically indicate a particular shape or design of each element. The material for the heating element is preferably a metal having a high melting pint such as tantalum, tungsten, molybdenum, platinum, rhenium, hafnium or the alloys of these metals. In particular, when the ceramic substrate is made of aluminum nitride, the material of the heating element is preferably pure molybdenum or an alloy containing molybdenum. The material of the heating element may also be a conductive material such as carbon, TiN or TiC, in addition to the high melting point metals described above.

According to the present invention, the first and second heating elements are provided substantially along the same plane. This definition will be described further. The present invention includes an embodiment that any part of each heating element passes through the plane "A". It is not required that the geometrical center of each heating element is on the plane "A" in a strict geometric meaning. In addition to this, it is allowed that the central plane of each heating element is dislocated from the intended plane "A" due to any reasons including manufacturing error, allowance or tolerance. However, from the viewpoint of the effects of the present invention, the distance between the central planes of the first and second heating elements is preferably not larger than 3 mm, and more preferably, not larger than 1 mm.

In the heating apparatus shown in FIGS. 1 to 3, the first and second heating elements are provided so that the elements are substantially parallel with the semiconductor mounting face 2a of the substrate 2. It is thus possible to further improve the temperature uniformity of the semiconductor mounting face. In this embodiment, the element may be parallel with the semiconductor mounting face 2a in a geometrically strict meaning. Alternatively, the element may be intersected at the semiconductor mounting face 2a at a sufficiently small angle such as −0.5 to +0.5 degree. Furthermore, a tolerance in the manufacturing process may be allowed.

The shape of each of the first and second power supply means is not particularly limited, and may be a rod shaped body, a wire shaped body or a combination of rod and wire shaped bodies. A material for each of the first and second power supply means is not particularly limited. The power supply means are separated from atmosphere 13 in a chamber and thus do not directly exposed to a highly corrosive substance. The material of the supply means may thus preferably be a metal and most preferably be nickel.

A material for each terminal for each heating element may preferably be the metals each having a high melting point as described above or nickel. Further, the terminal may be a cylindrical shaped terminal as shown in FIGS. 1 to 3, or a terminal having a shape of a pillar or a column other than a cylinder. It is not needed that the cross sectional area of the terminal be larger than that of the heating element. The cross sectional area of the terminal may, however, preferably be larger than that of the corresponding heating element, for improving the joining strength of the terminal and each of the first and second power supply means.

Each heating element does not necessarily have a planar pattern composed of one continuous line without branching or coupling between the corresponding terminals. Each heating element may have an electrical branching part or coupling part between the terminals.

The first and second power supply means may be electrically connected with each other, by means of a screw, caulking, fitting, soldering, welding or eutectic phase formation.

In a preferred embodiment, the first heating element is provided in an outer peripheral portion and the second heating element is provided in a central portion of the heater. It is thereby possible to perform multi-zone system control by adjusting the power supply to the inner and outer heating elements.

In a preferred embodiment, a semiconductor is mounted on the mounting face in the inner zone that the second heating element is provided in and not in the outer peripheral zone that the first heating element is provided in.

In a preferred embodiment, the heater is designed so that the temperature in the inner portion is higher than that in the outer portion when only the second heating element in the inner zone is heated. Further, the heater is designed so that the temperature in the central portion is lower than that in the outer peripheral portion when only the first heating element in the outer peripheral zone is heated.

In a preferred embodiment, the power supply to the heating elements is adjusted so that the temperature in the central portion of the mounting face is higher than that of the outer peripheral portion during a temperature ascending stage. Such control may be effective for preventing the fracture of the ceramic material used for the heater.

Each of the zones of the first and second heating elements may be further divided into a plurality of subzones. In this case, heating elements are provided in the corresponding subzones, respectively, and are not electrically connected with each other.

Each heating element may be provided on the surface of the substrate. In a preferred embodiment, the first and second heating elements are embedded in the substrate.

In a preferred embodiment, the supporting member is fixed onto the central portion of the back face of the heater. In this case, it is necessary to design the conductive connectors so that the terminals for the first heating element and the terminals for the second heating element are located in the central portion of the back face of the heater.

In a preferred embodiment, a conductive connector is provided in the zone that the second heating element is provided in and in the same plane. The conductive connector is connected with the first heating element and with the first terminal, and is not connected with the second heating element. FIGS. 1 to 3 relate to this embodiment. That is, the conductive connector 8A is provided in the plane "A" and in the zone 16 for providing the second heating element 4. The conductive connector 8A is connected with the first heating element 3 and the first terminals 6A, and is not connected with the second heating element 4.

In this embodiment, the temperature on the mounting face around the conductive connector 8A tends to be lower in the inner and central zone 16. It is therefore preferred to increase the calorific power per unit area of each of the heating element 4 and the conductive connector 9A around or near the connector 8A, so as to prevent a temperature reduction around the connector 8A.

A method for increasing the calorific power per unit area of each of the heating element and the conductive connector is known. For example, the surface area of the heating element or the resistance of the heating element may be increased. For example, when the heating element is formed of a mesh (mesh shaped body), the density of wires constituting the mesh may be increased, or the cross sectional area of the wires may be reduced, around the conductive connector 8A. When the heating element is formed of a coil spring, the number of windings per unit length of the coil spring may be increased (the pitch may be made smaller). Alternatively, the diameter of the coil may be increased, or the cross sectional area of the wire constituting the coil spring may be reduced, around the conductive connector 8A. When the heating element is formed of a ribbon, the width of the ribbon may be reduced around the conductive connector 8A.

The distance between the conductive connectors 8A for the heating element in the outer zone is preferably smaller. For reducing the distance, the conductive connectors 8A may be provided inside the conductive connectors 9A for the heating element in the inner zone. The distance between the conductive connectors 8A is preferably smaller than that between the conductive connectors 9A. Further, the distance "WO" between the terminals 6A for the first heating element is preferably not larger than the distance "WI" between the terminals 7 for the second heating element.

It is not required that the conductive connector constitutes one continuous conductive line without branching or coupling between the heating element and the terminal. For example, the conductive connector may have an electrical branching part or connecting part. It is preferred to provide a plurality of conductive connectors between the heating element and terminal to form a parallel circuit, so as to reduce the total resistance, heat generation and the adverse effects on the temperature distribution on the semiconductor mounting face.

The metal constituting the conductive connector includes the high melting point metal described above and nickel. The shape of the conductive connector may be a coil, ribbon, mesh, plate or film, as described above. Furthermore, the conductive connector may generate heat or does not substantially generate heat, when a power is supplied.

In a preferred embodiment, as shown in FIG. 1, each of the heating elements 3, 4 are provided symmetrically with respect to a straight line "M." The line "M" is parallel with the plane "A" with the heating element provided in and passes through a center "O" of the substrate. It is thereby possible to further improve the uniformity of the temperature distribution on the semiconductor mounting face.

An electrode element for generating a high frequency or for an electrostatic chuck may be embedded within the substrate, in addition to the heating elements, terminals and conductive connectors described above.

In a preferred embodiment, a conductive connector is provided in the zone where the second heating element is located and in another plane that is different from the plane "A" where the heating elements are located. The conductive connector is connected with the first heating element and with the first terminal, and is not electrically connected with the second heating element.

Figure 4:
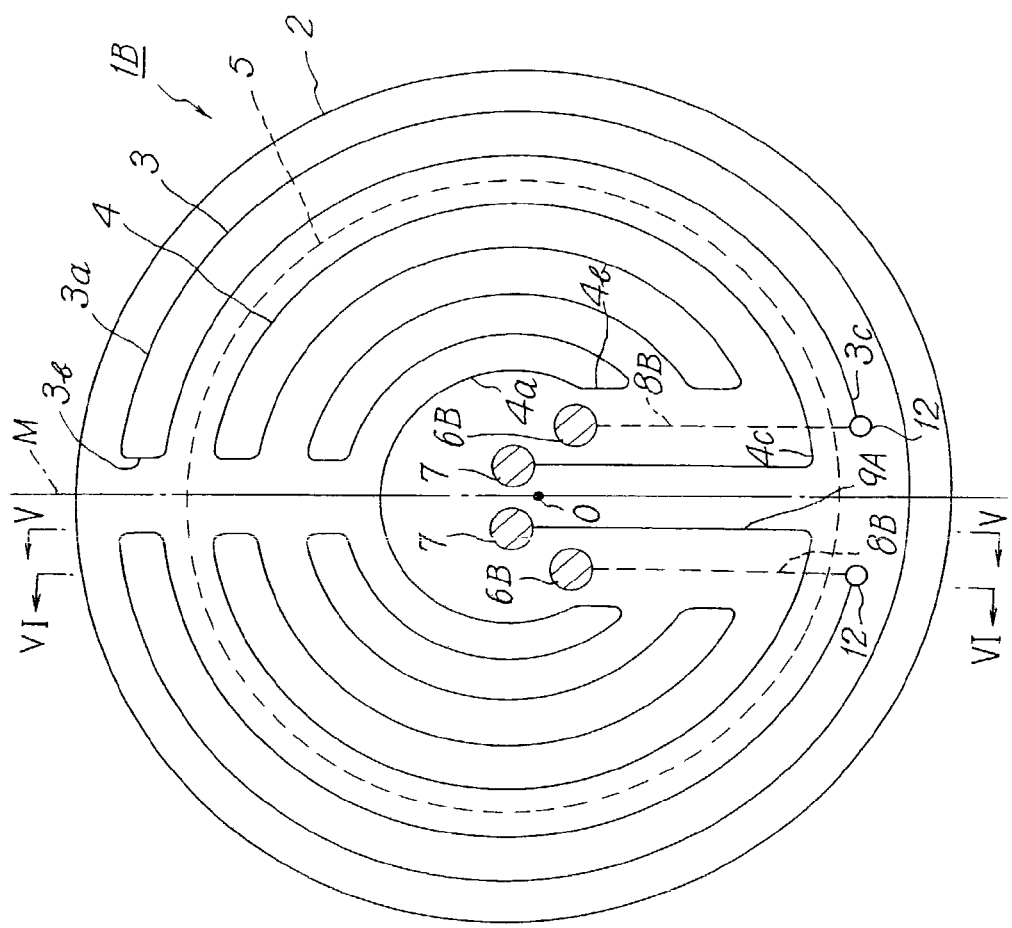
FIG. 4 is a schematic view showing a planar pattern of heating elements 3, 4 and conductive connectors 8B, 9A in a plane "A" in a heating apparatus 10B according to another embodiment of the present invention.
Figure 5:
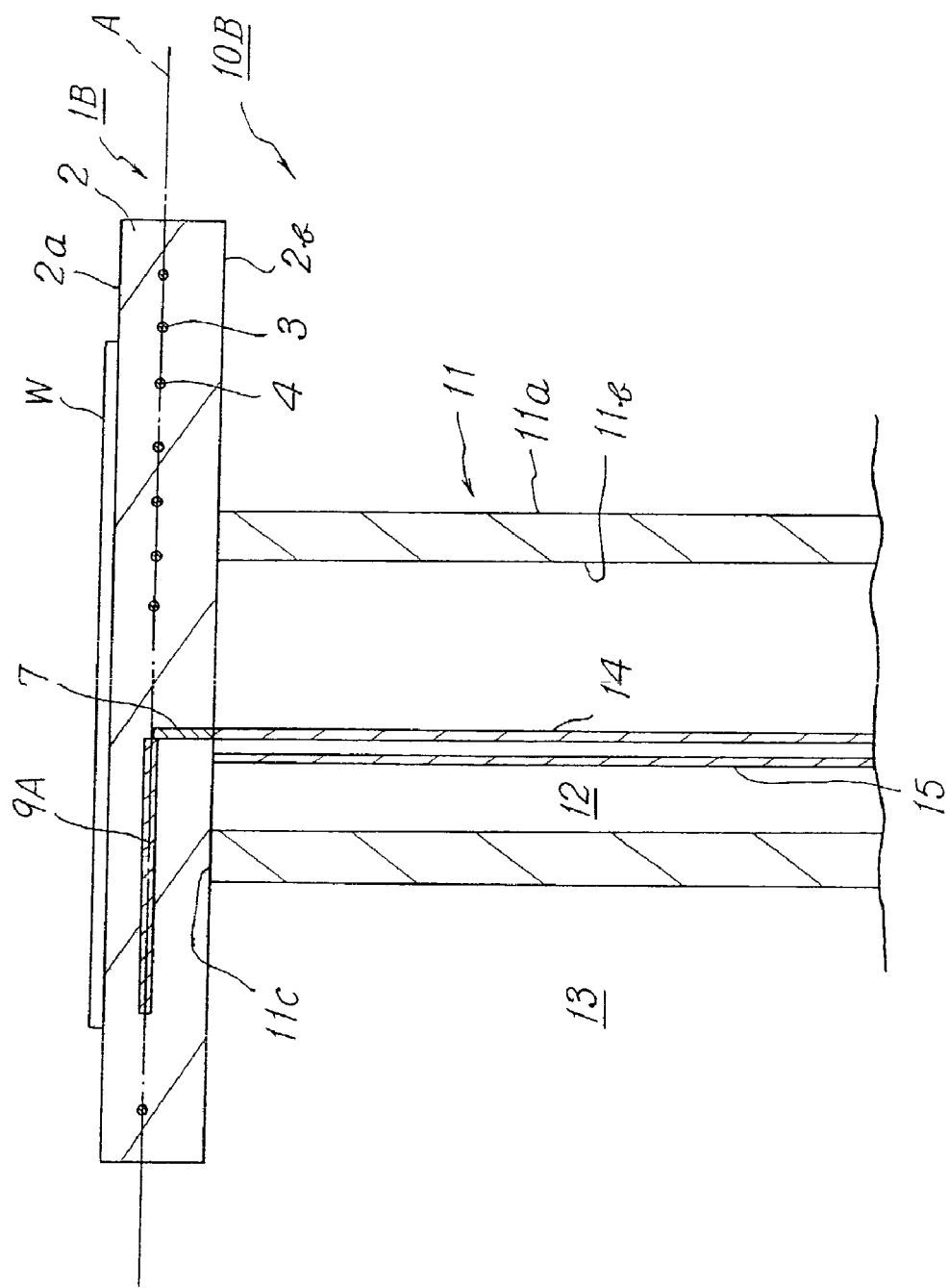
FIG. 5 is a cross sectional view showing a heating apparatus 10B cut along a line V-V of FIG. 4.
Figure 6:
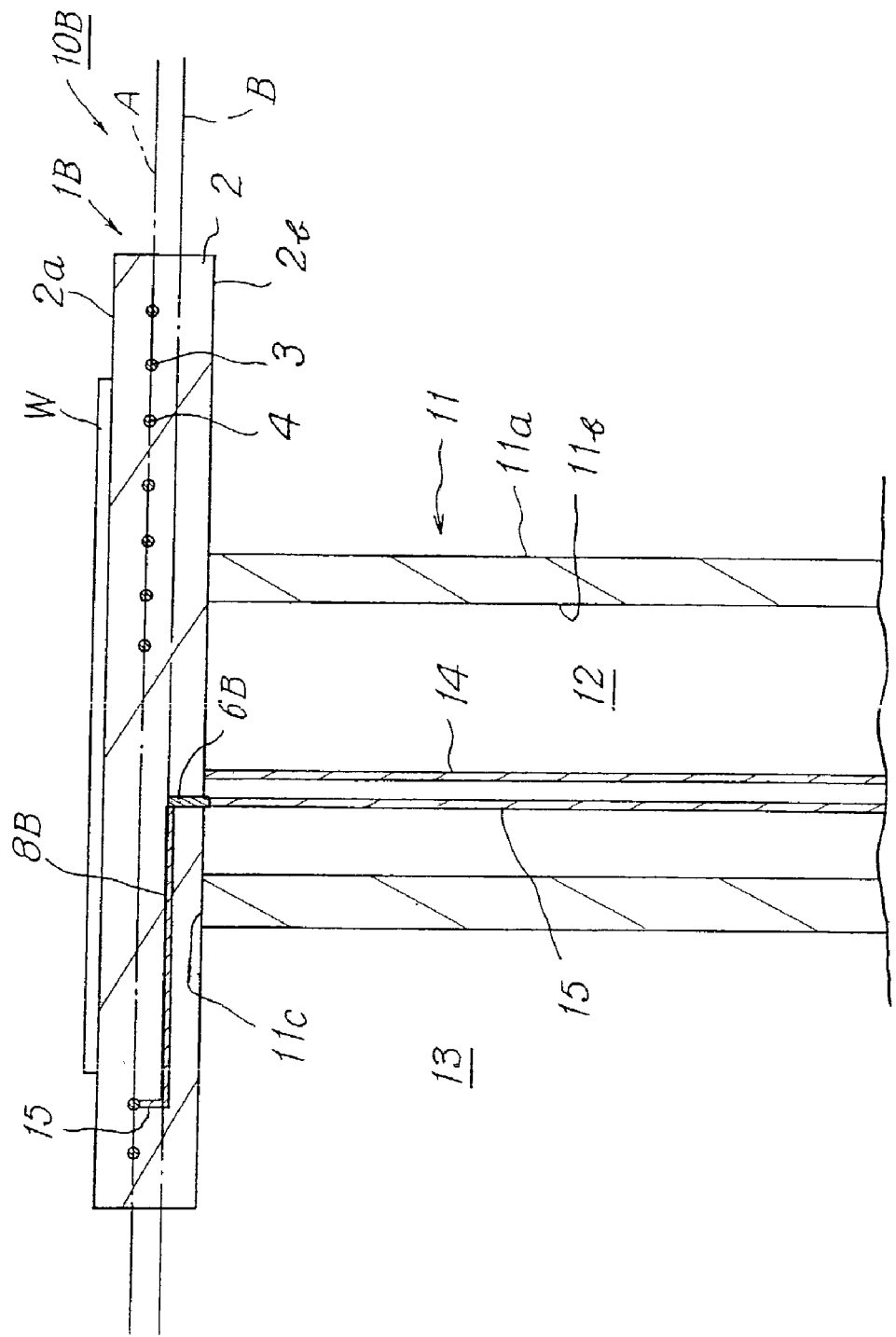
FIG. 6 is a cross sectional view showing a heating apparatus 10B cut along a line VI-VI of FIG. 4.

FIGS. 4 to 7 relate to this embodiment. FIG. 4 is a schematic view showing a planar pattern of heating elements 3, 4 in the plane "A", in a heating apparatus according to this embodiment. FIG. 5 is a cross sectional view schematically showing a heating apparatus 10B cut along a line V-V of FIG. 4, and FIG. 6 is a cross sectional view schematically showing a heating apparatus 10B cut along a line VI-VI. These figures show parts substantially same as those shown in FIGS. 1 to 3. The parts are specified by the same numerals as those used in FIGS. 1 to 3 and the explanation may be omitted.

In the present example, as shown in FIGS. 4 and 5, one end 4c of a second heating element 4 is connected with one end of a conductive connector 9A. The other end of the connector 9A is connected with a terminal 7. Additionally, as shown in FIGS. 4 and 6, each end 3c of a first heating element 3 located in an outer zone is connected with a terminal 6B through a conductive connector 8B and a connecting members 15. The terminals 6B are connected with first power supply means 15, respectively. The connecting member 9A is elongated in a direction substantially perpendicular to the plane "A" and in the thickness of the substrate. The conductive connector 8B is elongated along a plane "B" different from and parallel with the plane "A".

In the present example, the conductive connector 8B is provided along another plane "B" different from the plane "A" with the heating elements provided in. It is thus possible to omit the conductive connector 8A shown in FIG. 1 for the outer heating element 3 in the plane "A". As a result, it is thus possible to prevent cold spots described above on the mounting face induced around or near the conductive connector 8B when the connector is provided in the plane "A".

The plane "B" may be located between the plane "A" and the back face 2b, or located between the plane "A" and the semiconductor mounting face.

In a preferred embodiment, a connecting terminal 17 is provided between the first heating element 3 and the connecting member 15, as shown in FIG. 7(a). Further, a connecting terminal 16 is provided between the connecting member 15 and conductive connector 8B.

In a preferred embodiment, as shown in FIG. 7(a), the connecting member 15 for connecting the conductive connector 8B and first heating element 3 is made of a flexible material. In this case, when the relative position of the heating element 3 and connector 8B is changed, the connecting member 15 may be deformed following the change of the relative position, so as to prevent the breakage of the element. In particular, when the substrate is produced by means of hot pressing, the thickness of the substrate 2 may be substantially reduced during the hot pressing. In this embodiment, if the connecting member 15 is inflexible or not deformable, such member 15 may not follow the reduction of the thickness, so as to induce the breakage or the increase of resistance in or around the connecting member 15.

From this point of view, as shown in FIG. 7(b), the connecting member 15 may be preferably be formed of a coil spring 15A.

EXAMPLES

Example 1

The heating apparatus shown in FIGS. 1 to 3 was produced. The substrate 2 was made of an aluminum nitride sintered body. The substrate 2 had a diameter ϕ of 250 mm and a thickness of 10 mm. The second heating element 4 was embedded in the substrate 2 and in the inner zone 16 having a diameter ϕ of 200 mm, which corresponded with the diameter of a semiconductor wafer to be mounted on the mounting face. The first heating element 3 was embedded in the substrate 2 and in the outer zone 17 whose inner diameter was 200 mm and outer diameter was 250 mm. Each of the heating elements had a shape of a coil spring and was made of molybdenum. Each of the terminals 6A and 7 had a cylindrical shape and was made of molybdenum. The conductive connectors 8A and 9A were molybdenum wires.

The supporting member 11 was formed of an aluminum nitride sintered body. The supporting member 11 had an outer diameter ϕ of 80 mm, an inner diameter ϕ of 50 mm and a length of 250 mm. The supporting member 11 is solid-phase welded to the central portion of the back face of the substrate 2. It is preferred to form a sealing surface, a slitting, a hole for positioning or a groove on the end face 11c, for facilitating the fixing of the supporting member to the heater. The power supply means 14, 15 each composed of a nickel rod were inserted into the inner space 12 of the supporting member 11 and connected with the corresponding terminals, respectively.

Example 2

The heating apparatus 10B shown in FIGS. 4 to 6 was produced. The substrate 2 was formed of an aluminum nitride sintered body. The substrate 2 had a diameter ϕ of 250 mm and a thickness of 10 mm. The second heating element 4 was embedded in the substrate and in the inner zone 16 having a diameter ϕ of 200 mm, which corresponded with the diameter of a semiconductor wafer to be mounted on the mounting face. The first heating element 3 was embedded in the substrate 2 and in the outer zone 17 whose inner diameter was 200 mm and outer diameter was 250 mm. Each of the heating elements had a shape of a coil spring and was made of molybdenum. Each of the terminals 6B and 7 had a cylindrical shape and was made of molybdenum. The conductive connectors 9A and 8B were molybdenum wires. The connecting member 15 is formed of a coil spring made of molybdenum.

The supporting member 11 same as the example 1 was prepared. The supporting member 11 was solid-phase welded to the back face 2b of the substrate 2, according to the same procedure as in the example 1. The power supply means 14, 15 each formed of a nickel rod were inserted into the inner space 12, and connected to the corresponding terminals, respectively.

As described above, the present invention provides a heating apparatus usable for a system for producing a semiconductor. According to the apparatus, the uniformity of temperature on a semiconductor mounting face may be improved and the exposure of a terminal of the heater to atmosphere in the system may be prevented. Moreover, an increase of heat capacity of the heating system may be prevented and the fixing of the heater to the system may be facilitated.

The present invention has been explained referring to the preferred embodiments. However, the present invention is not limited to the illustrated embodiments which are given by way of examples only, and may be carried out in various modes without departing from the scope of the invention.

The invention claimed is:

1. A heating apparatus for a semiconductor producing system, said apparatus comprising:
   a heater having a mounting face for mounting a semiconductor, an opposed back face, an outer peripheral portion and an inner portion, said heater comprising a plate-shaped ceramic substrate having said mounting face, a first heating element embedded in said ceramic substrate in said outer peripheral portion and comprising a resistance heating material having a coil spring shape, a second heating element embedded in said ceramic substrate in said inner portion and comprising a resistance heating material that is independently controllable with respect to said first heating element, said second heating element having a coil spring shape, at least a pair of first terminals embedded in said ceramic substrate and connected with said first heating element and at least a pair of second terminals embedded in said ceramic substrate and connected with said second heating element;
   a supporting member, comprising a ceramic material, fixed to said back face of said heater in said inner portion, said supporting member having an outer surface, an inner surface facing an inner space and a length that is larger than a width thereof;
   first power supply means connected with said first terminal at said back face of said heater and contained in said inner space of said supporting member;
   second power supply means connected with said second terminal at said back face of said heater and contained in said inner space of said supporting member;
   at least a pair of first conductive connectors embedded in said ceramic substrate that are connected with ends of said first heating element, respectively, and with said first terminals, respectively, and that are not connected with said second heating element; and
   at least a pair of second conductive connectors embedded in said ceramic substrate that are connected with ends of said second heating element, respectively, and with said second terminals, respectively, and that are not connected with said first heating element;
   wherein said first heating element and said second heating element are provided substantially along the same plane in a manner such that said first and said second heating elements are not electrically connected with each other and such that each said first and said second heating elements are symmetrically arranged on opposing sides of a straight line of symmetry parallel with said plane;

wherein said pair of first conductive connectors and said pair of second conductive connectors are provided in said plane, and said pair of first conductive connectors are provided between said pair of second conductive connectors in said inner portion;

wherein said first and second terminals and said second conductive connectors are provided in said inner portion but are not present in said peripheral outer portion;

wherein a distance WO between said pair of first terminals is less than a distance WI between said pair of second terminals; and wherein said first conductive connectors are provided in said inner portion and in said outer peripheral portion.

* * * * *